United States Patent [19]
Becerra

[11] Patent Number: 5,886,512
[45] Date of Patent: Mar. 23, 1999

[54] LOW POWER AND WIDE INPUT VOLTAGE RANGE DC TO DC SWITCHING CONVERTER

[75] Inventor: Roger C. Becerra, Fort Wayne, Ind.

[73] Assignee: General Electric Company, Schenectady, N.Y.

[21] Appl. No.: 770,667

[22] Filed: Dec. 20, 1996

[51] Int. Cl.⁶ .............................. G05F 1/40; H02M 3/335
[52] U.S. Cl. .......................... 323/282; 323/285; 323/901
[58] Field of Search .................... 323/282, 222, 323/285, 328, 247, 901; 363/21, 20; 361/101; 318/171, 722, 189, 138, 725

[56] References Cited

U.S. PATENT DOCUMENTS

| | | | |
|---|---|---|---|
| 3,274,471 | 9/1966 | Moczala | 318/138 |
| 3,840,799 | 10/1974 | Macko et al. | 318/722 |
| 4,302,717 | 11/1981 | Olla | 323/282 |
| 4,533,986 | 8/1985 | Jones | 363/17 |
| 4,677,366 | 6/1987 | Wilkinson et al. | 323/222 |
| 4,694,240 | 9/1987 | Griinsch | 323/285 |
| 4,851,751 | 7/1989 | Gipson | 318/599 |
| 4,929,882 | 5/1990 | Szepesi | 323/222 |
| 4,935,861 | 6/1990 | Johnson, Jr. et al. | 363/132 |
| 4,942,509 | 7/1990 | Shires et al. | 363/89 |
| 5,404,053 | 4/1995 | Poma et al. | 327/108 |
| 5,499,184 | 3/1996 | Squibb | 363/21 |
| 5,636,097 | 6/1997 | Palara et al. | 361/101 |

*Primary Examiner*—Peter S. Wong
*Assistant Examiner*—Rajnikant B. Patel
*Attorney, Agent, or Firm*—Senniger, Powers, Leavitt & Roedel; Wayne O. Traynham

[57] ABSTRACT

A power supply for supplying power from a direct current (DC) source to a load. A load control circuit connected to the load and connected to the DC source regulates a voltage applied to the load. An inductive circuit connected to the load control circuit supplies power to the load. A switching circuit is connected between the DC source and the inductive circuit and responds to the inductive circuit. The inductive circuit supplies power to the switching circuit and controls the switching circuit to selectively connect the DC source to the inductive circuit.

25 Claims, 5 Drawing Sheets

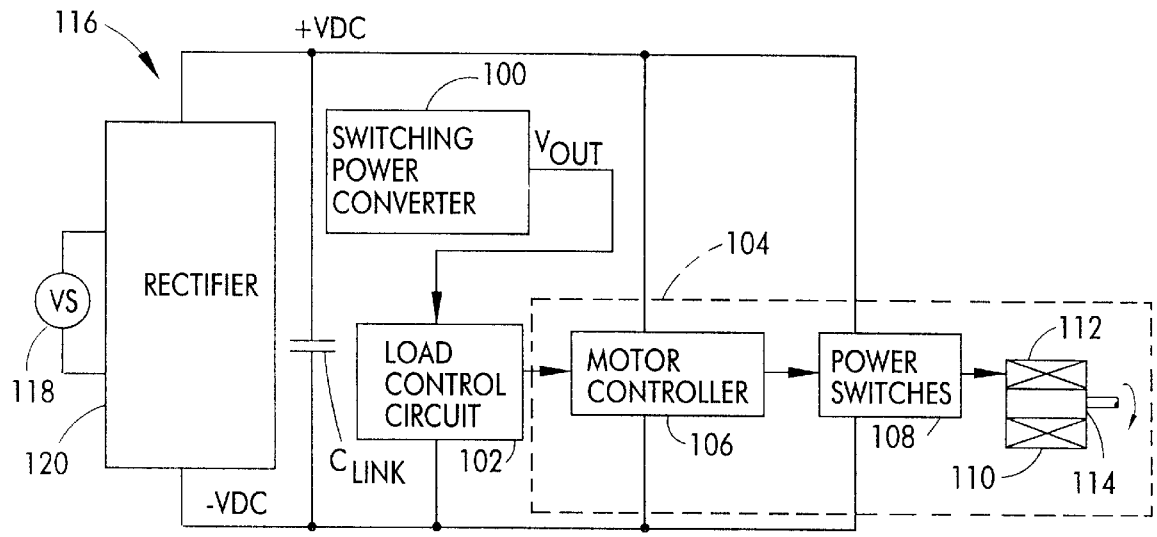
FIG.1 TYPICAL SWITCHING POWER CONVERTER APPLICATION
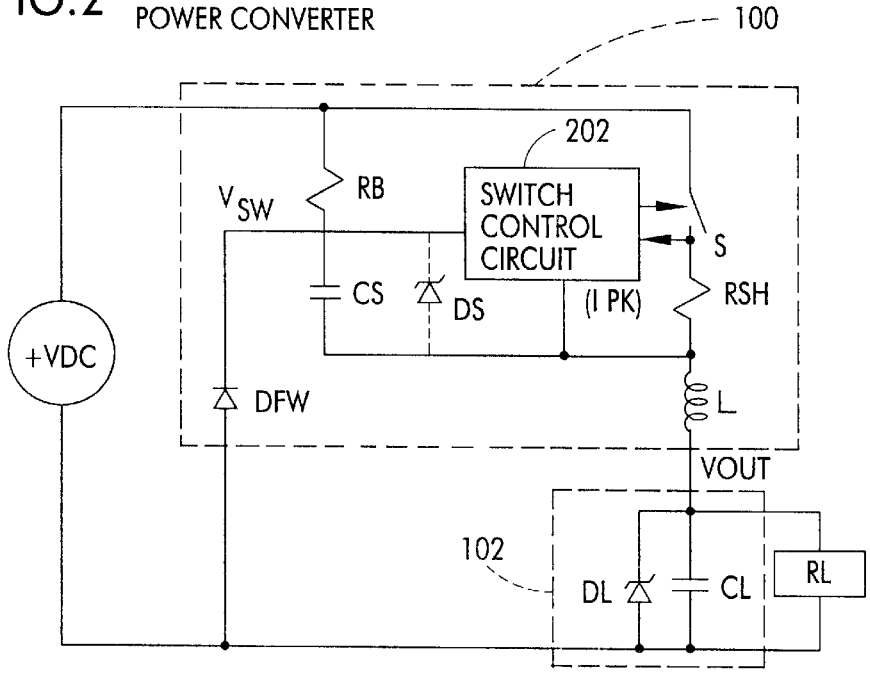
FIG.2 BASIC ELEMENTS OF THE SWITCHING POWER CONVERTER

FIG.3a
TWO OPERATING STATES OF THE SWITCHING POWER CONVERTER: SWITCH S ON
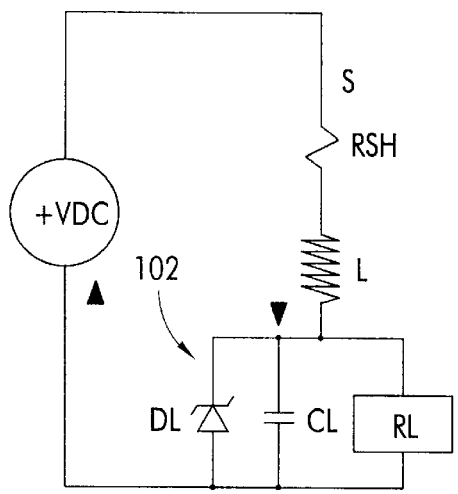
FIG.3b
TWO OPERATING STATES OF THE SWITCHING POWER CONVERTER: SWITCH S OFF
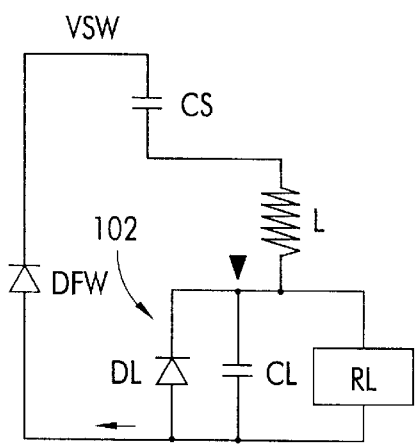
FIG.4A  CURRENT WAVEFORMS: SWITCH S CURRENT
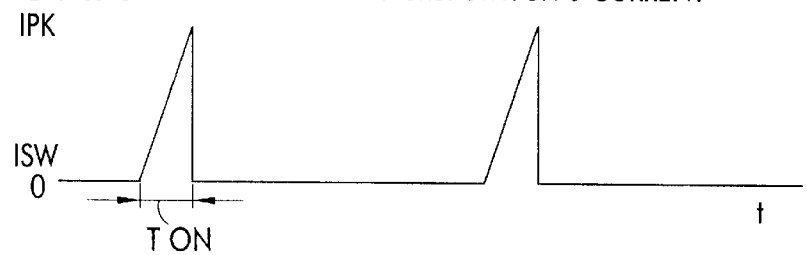
FIG.4B  CURRENT WAVEFORMS: FREEWHEELING CURRENT
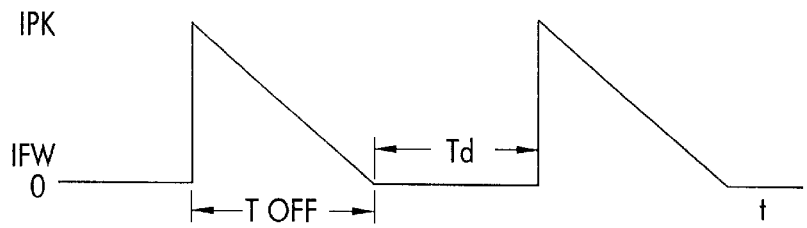
FIG.4C  CURRENT WAVEFORMS: INDUCTOR CURRENT
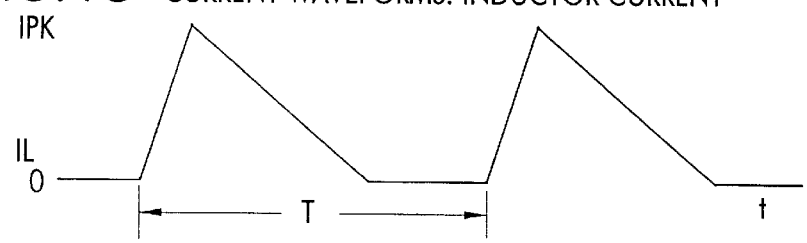

FIG.7
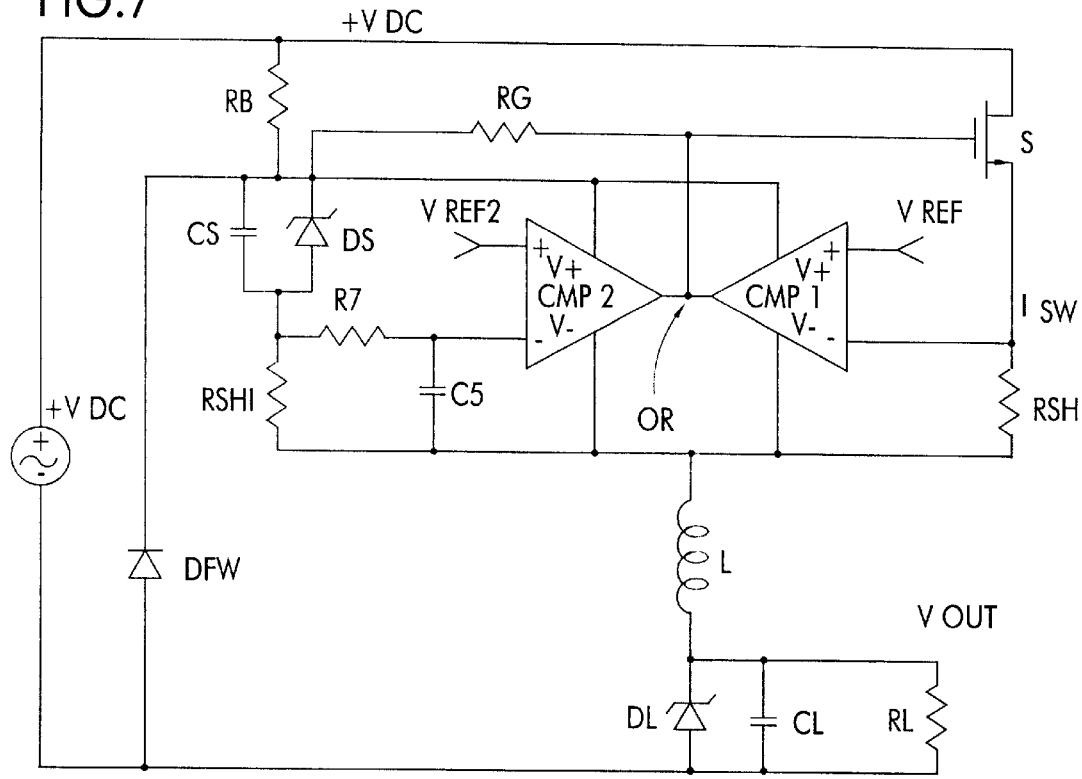
FIG.8 LOW POWER DC/DC CONVERTER
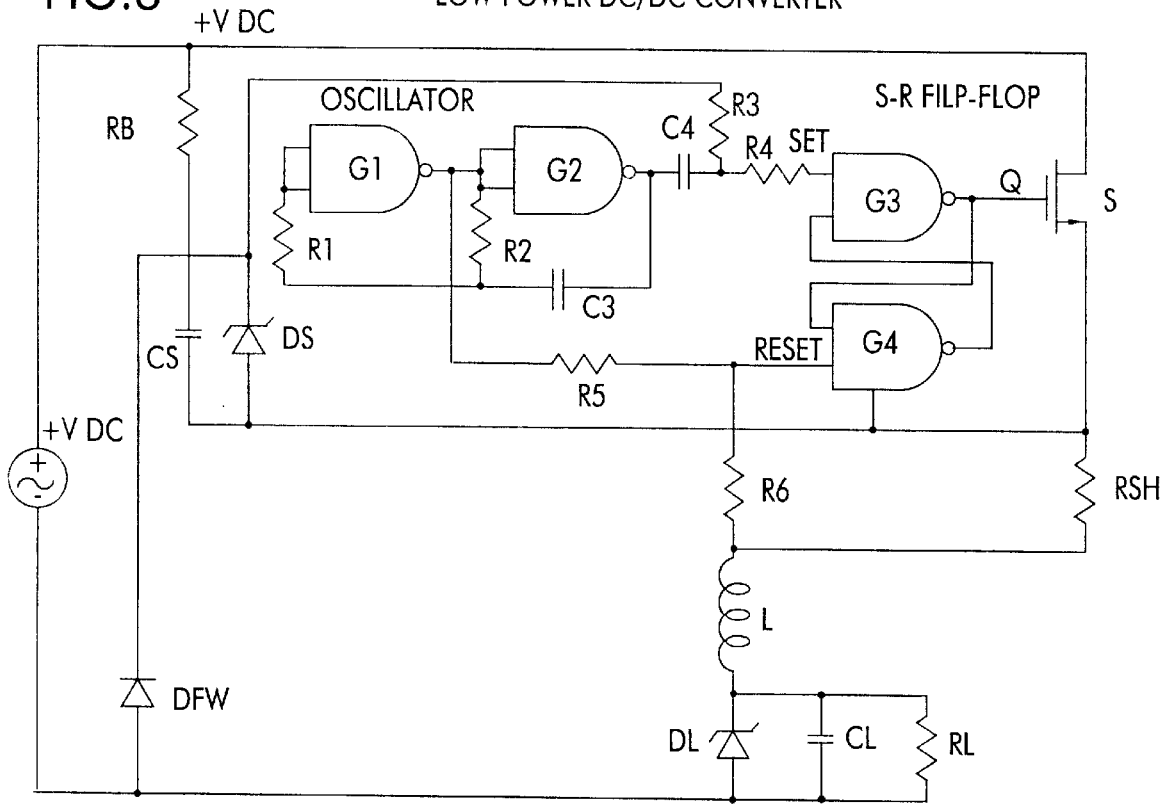

FIG.9 ISOLATED LOW POWER DC/DC CONVERTER
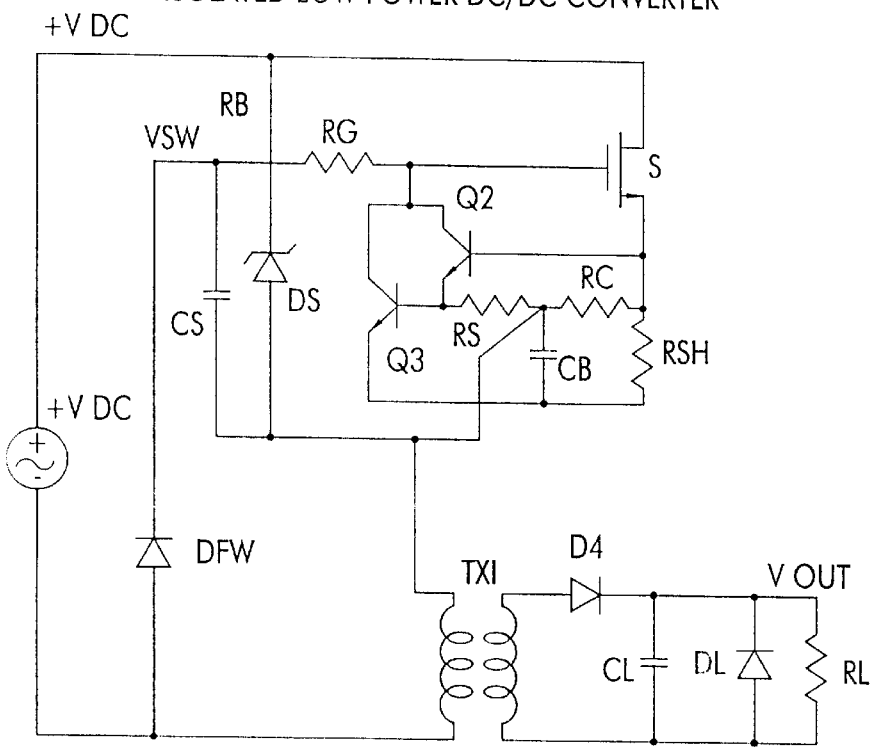
FIG.10 CONTROLLED OPERATION
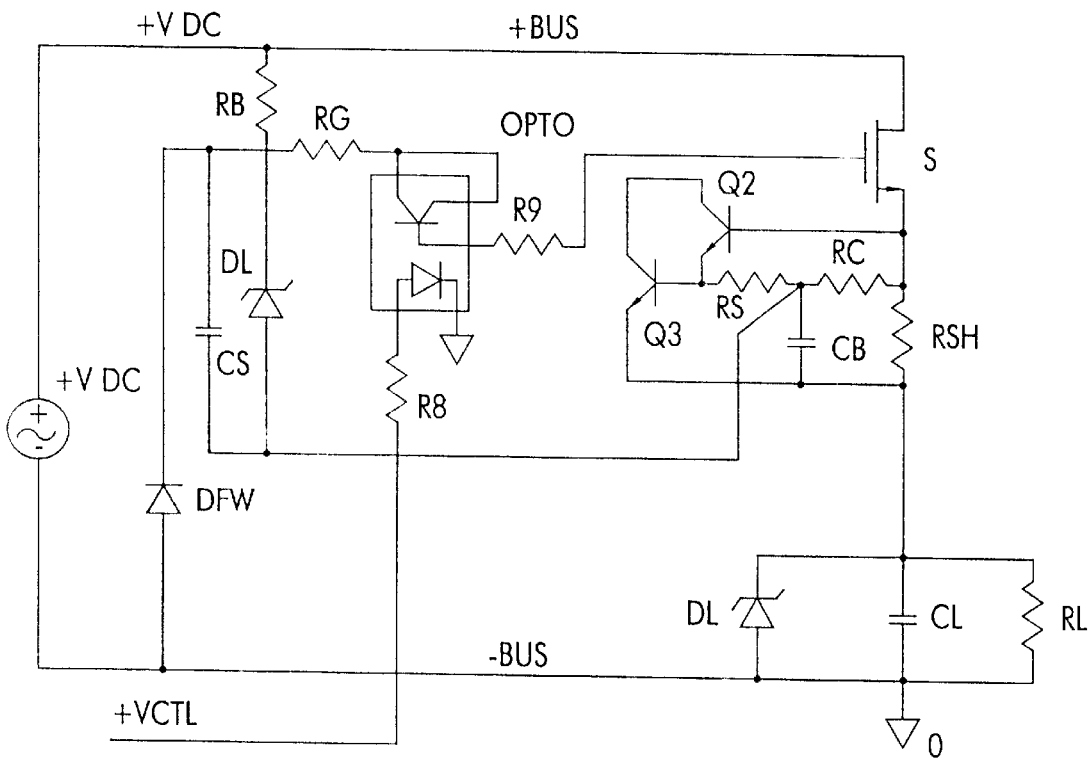

//]: #

LOW POWER AND WIDE INPUT VOLTAGE RANGE DC TO DC SWITCHING CONVERTER

BACKGROUND OF THE INVENTION

1. Field of the Invention

The invention generally relates to switching converters which accept a wide range of input voltages and, in particular, to converters which generate a substantially constant, low power, reduced dc voltage output.

2. Description of the Prior Art

Power switching converters convert high voltage alternating current into low voltage direct current. In the past, many converters generally employ step down transformers followed by a rectifier, filter and a voltage regulator. Alternatively, some converters include a ballast supply which is capacitively coupled by two capacitors which are connected to the alternating current line followed by a rectifier and filter. Such converters tend to be expensive and susceptible to transmitting voltage spikes. There is need for low cost converters which provide a level direct current essentially independent of a wide input alternating current voltage.

SUMMARY OF THE INVENTION

It is an object of this invention to provide a switching converter having a wide input voltage operating range suitable for enabling low voltage power for the control electronics of electronically commutated motors.

It is another object of this invention to provide a switching DC to DC converter which has a low voltage output which is immune to disturbances or transients supplied as part of the AC input voltage.

It is another object of this invention to provide a low cost, wide input voltage range, low output voltage, low power output switching converter which operates from a voltage source inverter which accepts an input of up to 500 volts, which avoids the need for an undervoltage protection circuit, which can be operated at low input voltages, and which can be set on a disabled or sleep mode to save power whenever its operation is not required.

It is another object of this invention to provide a switching converter which has only two connections which are required in circuits with power and control sections separated.

In one form, the invention comprises a power supply for supplying power from a direct current (DC) source to a load. A load control circuit connected to the DC source and connected to the load regulates a voltage applied to the load. An inductive circuit connected to the load control circuit load supplies power to the load. A switching circuit is connected between the DC source and the inductive circuit and is responsive to the inductive circuit. The inductive circuit supplies power to the switching circuit and controls the switching circuit to selectively connect the DC source to the inductive circuit.

In another form, the invention comprises a switching power converter for supplying power to a load control circuit connected to a load and connected to a direct current (DC) power source, the load control circuit for regulating a DC voltage applied to the load. An inductive circuit connected to the load control circuit and/or connected to the load for supplies power to the load. A switching circuit is connected between the DC source and the inductive circuit and responsive to the inductive circuit wherein the inductive circuit supplies power to the switching circuit and controls the switching circuit to selectively connect the DC source to the inductive circuit.

In another form, the invention comprises a motor for use with an alternating current (AC) source. A rectifier circuit is connected to the AC source and provides a direct current (DC) source. A rotatable assembly in driving relation to a motor winding rotates the rotatable assembly. A power switching circuit selectively connects the DC source to the motor winding. A controller controls the power switching circuit to commutate the motor winding. A load control circuit connected to the controller and to the DC source regulates a voltage applied to the controller. An inductive circuit connected to the load control circuit and/or connected to the controller supplies power to the controller. A switching circuit is connected between the DC source and the inductive circuit and is responsive to the inductive circuit. The inductive circuit supplies power to the switching circuit and controls the switching circuit to selectively connect the DC source to the inductive circuit.

Other objects and features will be in part apparent and in part pointed out hereinafter.

BRIEF DESCRIPTION OF THE DRAWINGS

FIG. 1 is a block diagram of a switching power converter for generating an output voltage (Vout) provided to a load control circuit for driving a load, such as a motor controller for controlling power switches to commutate a motor winding in driving relation to a rotatable assembly, according to the invention.

FIG. 2 is a schematic diagram of one preferred embodiment of a DC to DC switching converter according to the invention in combination with a load control circuit for driving a load (RL).

FIG. 3A illustrates a schematic diagram of one operating state of the switching converter of FIG. 2 in which the switch is "on" or closed and DC power is provided to the inductor.

FIG. 3B illustrates a schematic diagram of another operating state of the switching converter of FIG. 2 in which the switch is "off" or open and energy stored in the inductor is transferred through a free wheeling diode (DFW) and is used to supply a charge to capacitors CS and CL.

FIGS. 4A, 4B, and 4C illustrate graphs of current amplitude along the y-axis and time along the x-axis of the waveforms for the current (ISW) through switch S, the free wheeling current (IFW) and the inductor current (IL), respectively.

FIG. 7 illustrates a schematic diagram of one preferred embodiment of a comparator implementation of the switch control of the switching converter of FIG. 2.

FIG. 8 illustrates a schematic diagram of one preferred embodiment of a set/reset flip-flop implementation of the switch control of the switching converter of FIG. 2.

FIG. 9 illustrates a schematic diagram of one preferred embodiment of an isolated implementation of the switch control of the switching converter of FIG. 2.

FIG. 10 illustrates a schematic diagram of one preferred embodiment of an enable/disable control including an optocoupler for a switching power supply according to the invention.

Corresponding reference characters indicate corresponding parts throughout the drawings.

DESCRIPTION OF THE PREFERRED EMBODIMENTS

Figure 5:
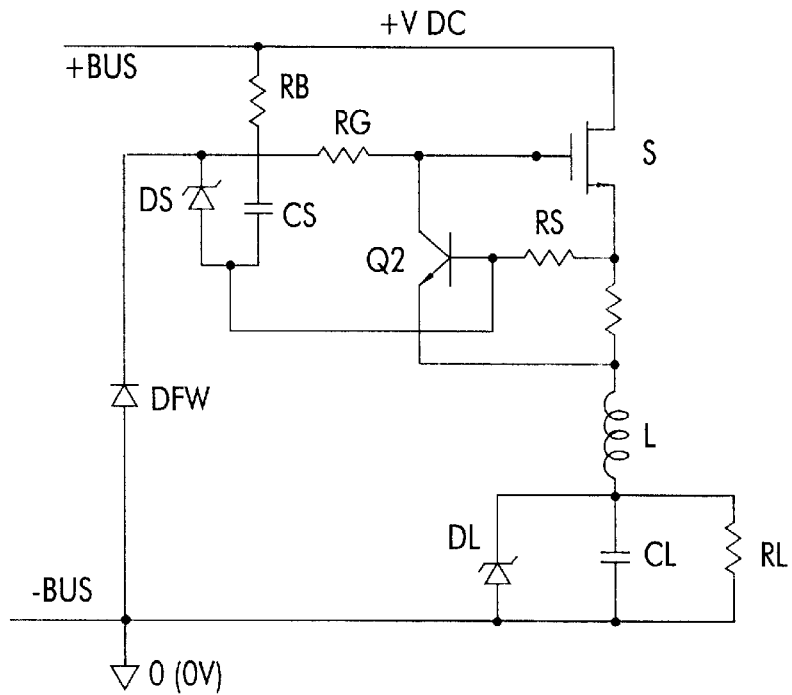
FIG. 5 illustrates a schematic diagram of one preferred embodiment of a single transistor implementation of the switch control of the switching converter of FIG. 2.

FIG. 1 is a block diagram of a switching power converter 100 according to the invention for generating an output voltage (VOUT). The output voltage is provided to a load control circuit 102 for driving a load 104 which is illustrated as a motor controller 106, power switches 108, and a motor 110. The motor controller 106 controls the power switches to commutate windings 112 of the motor 110 which windings are in driving relation to a rotatable assembly 114.

Typically, the power switching converter 100 is connected to a power circuit 116 for supplying an input dc voltage (+VDC, −VDC) on a dc bus. The dc voltage is derived by rectifying an ac line voltage 118 by a rectifying circuit 120. The voltage output (VOUT) of the switching power converter 100 is a low voltage output which may be used to power a circuit controlling a load. As shown in FIG. 1 merely as example, the load 104 is a motor system.

Converter 100 may typically require a small capacitance $C_{LINK}$ across the dc bus (+VDC, −VDC) between the rectifier 120 and the switching power converter 100. When the load is a power switching converter, this capacitance is usually part of the capacitance required by the load. In the event that the power switching converter 100 is part of a battery operated system, the ac line voltage 118 and rectifier 120 would be replaced by a battery so that no rectifier would be necessary.

One preferred embodiment of the elements of the switching power converter 100 according to the invention is illustrated in schematic diagram form in FIG. 2. A capacitor CL and a Zener diode DL comprise the load control circuit 102 to keep a voltage VOUT applied to a load RL at or near a constant magnitude. Any current excesses due to load changes are diverted through the Zener diode DL which performs the voltage regulation function in the FIG. 2 embodiment. Switch control circuit 202 controls the opening and closing of a switch S in response to the voltage sensed on a shunt resistor RSH. Various implementations of the switch control circuit 202 will be described below. A resistor RB is typically a large resistor value and serves the purpose of supplying an initial bias current to develop the voltage VSW to control switch S. A capacitor CS stores energy to activate the switch control circuit 202 and Zener diode DL regulates voltage VOUT and provides a path for the inductor current to circulate while keeping voltage VOUT constant. Optionally, a Zener diode DS shown in phantom may be connected across capacitor CS to limit the voltage VSW.

In order to operate over a wide input voltage, such as up to 500 volts, it is preferable that the switch control circuit 202 operate with a low bias current for start up so that sufficient bias current is supplied at low input voltages. For a given value of resistor RB, there is a minimum input voltage at which the converter 100 begins to operate and oscillate. Once the converter starts oscillating, capacitor CS is charged by the freewheeling current and resistor RB is no longer required for continued operation of the converter 100. Therefore, the value of resistor RB has to be small enough to satisfy the minimum input voltage start requirement and high enough to satisfy the power dissipation requirements at high input voltages.

In operation, the switch control voltage VSW builds up by charging capacitor CS via resistor RB. As the voltage VSW is building, switch S is kept open or off until the switch control voltage VSW has reached the minimum input voltage start requirement. At this point, switch control circuit 202 closes or turns on switch S. This causes current to build up within an inductor L. The current continues to build until a limit or peak current (Ipk) is detected via shunt resistor RSH by switch control circuit 202. FIG. 3A illustrates the circulating path for the current when switch S is closed and FIG. 4A shows the switch current waveform (ISW). As shown in FIG. 4A, the switch current (ISW) builds to a peak while the switch S is on and then immediately goes to zero when the switch S is turned off. Switch control circuit 202 monitors the voltage signal from resistor RSH to turn off the switch S when the voltage reaches a limit indicating that sufficient energy has been stored in the inductor L. At this point, circuit 202 interrupts current provided to the inductor L by opening switch S ending the Ton period (on-time period) and beginning the Toff period (off-time period). With switch S open, current in inductor L continues to flow and decrease in magnitude as it flows via a freewheeling diode DFW. FIG. 3B illustrates the current circulating path when switch S is open or off and FIG. 4B shows the current waveform (IFW) after switch S is turned off. This freewheeling current flowing through the freewheeling diode DFW decays as it supplies a charge to load capacitor CL and capacitor CS which keeps the switch control voltage at a sufficient level to activate the switch S again with another oscillating cycle after inductive current decays to zero. FIG. 4C illustrates the current waveform (IL) in inductor L of FIG. 2. Any ripple on the output voltage waveform can be significantly reduced and made small by properly selecting the value for capacitor (CL).

Two operating modes, discontinuous or continuous, are possible by activating the switch control circuit 202 while the freewheeling current is decaying through the freewheeling diode DFW. The discontinuous mode of operation is depicted by FIGS. 4A, 4B, and 4C and is useful when lower operating frequencies or lower inductance values are required. In discontinuous operation, the inductor current (IL) is allowed to decay towards zero at which time an off interval or a delay interval (Td) may be implemented. Alternatively, continuous operation can be achieved and used when a low current peak to average ratio is needed (i.e., low current ripple) and high oscillating frequencies can be tolerated. At low current levels, the dominant component of losses is switch S and the losses are primarily switching losses so that a reduction in the operating frequency or oscillating frequency reduces switching losses.

The oscillating frequency is determined by the inverse of the on time of switch S (Ton) plus the off time of switch S (Toff) plus the delay time (Td), i.e., the frequency is determined by the inverse of Ton+Toff +Td which is 1/(Ton+Toff+Td). The on and off time intervals are calculated by solving current equations for the current flowing in circuits within FIGS. 3A and 3B, respectively. The delay time is a time interval preset by an RC network or equivalent delay circuit within the switch control circuit 202.

It is contemplated that FIG. 2 may be suitable for low current levels. For high current requirements, a modification on the routing of the circulating inductive current may be necessary to reduce the energy required to keep the switch control circuit 202 within its operating limits. One important aspect of the invention is the use of inductive current stored in the inductor L to supply energy to the load RL as well as to replenish a reservoir of energy stored in capacitor CS to control the power converter switch control circuit 202. Another aspect of the invention is the use of a simple peak current regulating strategy so that when both these features are combined, the control is simplified and the overall converter cost is reduced.

The topology of the switch control circuit 202 of FIG. 2 may be implemented in several different ways, as will be recognized by those skilled in the art. In general, it is believed that the implementation of such a topology should be such that the bias current of the switch control circuit 202 be low. For example, low power components such as bipolar transistors, and low power comparators, CMOS logic ICs are suitable for this application. These and other aspects of the invention will be described in greater detail below.

FIG. 5 illustrates one preferred embodiment of the power switching converter 100 according to the invention implemented by a single transistor. The following Table 1 illustrates the exemplary component values for the circuits illustrated in FIGS. 5–10.

charging current and switch S is turned on. Current builds in inductor L which causes charging of capacitor CL. The CL charging current is sensed by shunt resistor RSH, and when the charging current reaches a preset level, a voltage develops across the terminals of resistor RSH which turns on transistor Q2. This turns off main switch S collapsing its voltage between the gate and source (in the case of a MOSFET). Inductive current in inductor L is diverted via capacitor CL, diode D1, capacitor CS, and resistors RB and RSH. This inductive current decays charging capacitors CS and CL while keeping transistor Q2 off its current state. When inductive current from the inductor L has decayed to a threshold level, transistor Q2 turns off resulting in switch S turning on to complete one oscillating cycle. Voltage across capacitors CS and CL increases with every oscillating cycle until a corresponding regulating voltage is reached. Regulating devices DS and DL, both Zener diodes, set the

TABLE 1

Component Values for Figures 5–10

Figure 6:
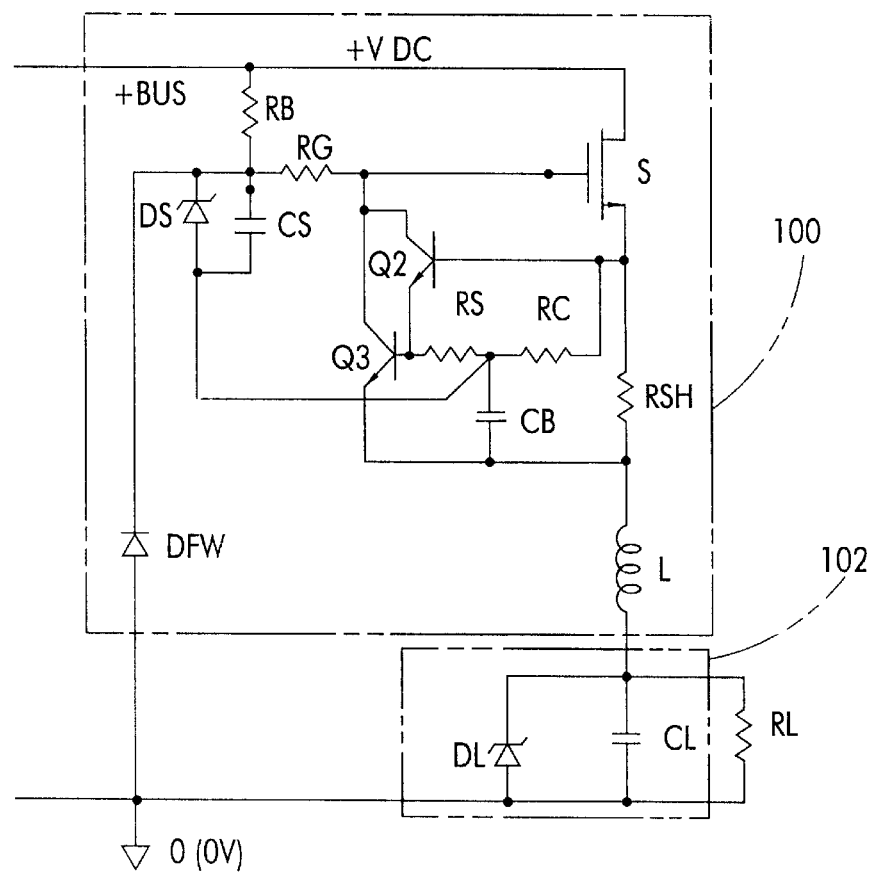
FIG. 6 illustrates a schematic diagram of one preferred embodiment of a bipolar transistor implementation of the switch control of the switching converter of FIG. 2.

| Part | Description | Fig. 5 | Fig. 6 | Fig. 7 | Fig. 8 | Fig. 9 | Fig. 10 |
|---|---|---|---|---|---|---|---|
|  | Max. voltage | 500 V | 500 V | 500 V | 500 V | 500 V | 500 V |
| DS | Zener diode | 1N4744 | 1N4741 | 1N4741 | 1N4741 | 1N4741 | 1N4741 |
| DFW | Fast Diode | 1N4937 | 1N4937 | 1N4937 | 1N4937 | 1N4937 | 1N4937 |
| DL | Zener Diode | 1N4744 | 1N4741 | 1N4741 | 1N4741 | 1N4741 | 1N4741 |
| CS | Capacitor | .1 $\mu f$ | .1 $\mu f$ | .1 $\mu f$ | .1 $\mu f$ | .1 u$\mu$ | .1 $\mu f$ |
| CL | Capacitor | 4.7 $\mu f$ | 22 $\mu f$ | 4.7 $\mu f$ | 4.7 $\mu f$ | 4.7 $\mu f$ | 4.7 $\mu f$ |
| L | Inductor | 2.5 mH | 2.5 mH | 2.5 mH | 2.5 mH | 2.5 mH | 2.5 mH |
| RB | Resistor ($\Omega$) | 450K | 450K | 450K | 450K | 450K | 450K |
| RG | Resistor ($\Omega$) | 7.5K | 7.5K | 2.7K | 0 | 7.5K | 7.5K |
| RSH | Shunt Resistor | 27 | 10 | 10 | 10 | 10 | 10 |
| RL | Load Resistor ($\Omega$) | 680 | 1K | 1K | 1K | 1K | 1K |
| S | MOSFET switch | 2SK2177 | 2SK2177 | 2SK2177 | 2SK2177 | 2.SK2177 | 2SK2177 |
| RS | Timing Resistor ($\Omega$) | 270 | 270 |  |  | 270 | 270 |
| Q2 | Transistor | 2N4401 | 2N4401 |  |  | 2N4401 |  |
| Q3 | Transistor |  | 2N4401 |  |  | 2N4401 |  |
| CB | Timing Capicitor |  | .1 $\mu f$ |  |  | .1 $\mu f$ |  |
| RC | Timing Resistor ($\Omega$) |  | 270 |  |  | 270 | 270 |
| G1,G2, G3,G4 | CMOS gates |  |  |  | CD4011 |  |  |
| R1 | Resistor ($\Omega$) |  |  |  | 4.7K |  |  |
| R2 | Resistor ($\Omega$) |  |  |  | 120K |  |  |
| R3 | Resistor ($\Omega$) |  |  |  | 10K |  |  |
| R4,R5 | Resistor ($\Omega$) |  |  |  | 100K |  |  |
| R6 | Resistor ($\Omega$) |  |  |  | 200K |  |  |
| C3,C4 | Capacitor |  |  |  | 150 pf |  |  |
| RSH1 | Resistor ($\Omega$) |  |  | 27 |  |  |  |
| R7 | Resistor ($\Omega$) |  |  | 200 |  |  |  |
| C5 | Capacitor |  |  | .1 $\mu f$ |  |  |  |
| CMP1, CMP2 | Comparator |  |  | LP339 |  |  |  |
| VREF1 | Voltage reference |  |  | 0.6 V |  |  |  |
| VREF2 | Voltage reference |  |  | 0V |  |  |  |
| TX1 | Transformer 1:1 |  |  |  |  | 2 mH |  |
| D4 | Diode |  |  |  |  | 1n4937 |  |
| OP1 | Optocoupler |  |  |  |  |  | H11A550 |
| R8 | Resistor ($\Omega$) |  |  |  |  |  | 1K |
| R9 | Resistor ($\Omega$) |  |  |  |  |  | 100K |
| VCTL | Control voltage |  |  |  |  |  | 5 V |

FIG. 5 illustrates a low voltage supply which is self-regulating and which employs peak current regulation. The operation of the schematic illustrated in FIG. 5 for a wide range power supply supplying an input to the circuit is as follows: the circuit is fed by a DC bus (+bus, –bus,) from 20 to 500 VDC. When a voltage (+VDC) is applied across the bus terminals, a capacitor CS is charged via resistors R1, RB, and RSH, inductor and capacitor CL. Resistors RB and RSH can be sized to keep a transistor Q2 in its on state while capacitor CS is being charged. This keeps main switch S in its off or closed state. When capacitor CS has reached a preset voltage, transistor Q2 is turned off by the low CS maximum voltage across capacitor CS and CL, respectively. The regulating voltage of Zener diode DS sets the maximum gate to source voltage of switch S and regulating voltage of Zener diode DL sets the voltage applied to the load RL.

One important aspect of this implementation of the invention is the use of the inductive current after the main switch S is turned off to increase the voltage across capacitor CS and keep transistor Q2 on while current is decaying through the freewheeling diode DFW. The oscillating frequency of the switching power converter 100 of FIG. 5 is set by the peak current level, the value of inductor L and the threshold level setting of switch Q2.

This implementation has been successfully tested with operating input voltages as low as 25 V and as high as 600 V on the DC bus, with a current average from 10 mA to 50 mA, with output voltages from 11 V to 18 V and within a temperature range from −40° C. to +80° C.

FIG. 6 illustrates another preferred embodiment of a wide range power supply according to the invention implemented by bipolar transistors. As with FIG. 5, FIG. 6 illustrates a low voltage supply which is self-regulating and which employ peak current regulation. In this embodiment of FIG. 6, the oscillating frequency is controlled by a time constant set by resistors RB and RC and capacitor CB. Transistor Q2 and transistor Q3 are in a darlington configuration which provides higher current gain to sharply turn off the main switch S when current has exceeded the maximum design setting. Table 1 illustrates the exemplary component values for this bipolar implementation. To employ a bipolar implementation which can handle rep to 600 VDC, resistor RG should be 4.3 k and switch S should be STD2NA6.

FIG. 7 illustrates another preferred embodiment of the invention wherein control implementation is accomplished by using two low power comparators CMP1, CMP2. Comparator CMP1 detects the switch current $I_{SW}$ by comparing the voltage developed across resistor RSH against a reference voltage source Vref1. Comparator CMP2 senses the current flowing in the freewheeling diode DFW after switch S is turned off and compares it against a voltage reference Vref2. In other words, comparator CMP1 compares a voltage developed in the shunt circuit to voltage reference VREF1 and comparator CMP2 compares a voltage developed by free wheeling current to the other voltage reference VREF2 so that the switch S is responsive to the comparator circuit. An off time interval implemented by a simple capacitor resistor combination of R7 and C5 is inserted after the inductor L has reached a minimum level. This off time interval helps to reduce the switching frequency when needed. In the implementation of FIG. 7, the comparators outputs are connected together in an OR type of connection so that switch S is kept in an off state when either comparator is at a low output state. Table 1 illustrates the exemplary component values.

FIG. 8 illustrates one preferred embodiment of a set-reset implementation in which an oscillator is configured to oscillate at a given frequency and a set-reset flip flop controls switch S. In this embodiment, a single 4-gate CMOS IC powered from supply VSW is used. The oscillator comprises gates G1 and G2 which begin to oscillate as soon as the supply voltage of the CMOS IC is such that the logic becomes valid. The oscillator output sets a S-R flip flop which is comprised of gates G3 and G4 via a differentiator network including capacitor C2 and resistor R3. The flip flop output Q commands switch S to turn on so that current is developed on the inductor L and sensed by shunt resistor RSH. When a preset current level is reached, the S-R flip flop is turned off. In this embodiment, the switch current can be developed during the first half of the oscillating period. During the second half of the oscillating period, the S-R flip flop is forced into a reset mode regardless of the amplitude of the switch current.

Some of the advantages of this approach illustrated in FIG. 8 are as follows: first, the switching frequency can be kept constant over a wide operating temperature. The oscillating frequency of the embodiments illustrated in FIGS. 1–6 may vary with variations in the temperature of the controlling device, e.g., the bipolar junction transistors of FIG. 6, when operating over a wide range of temperatures such as from −40° C. to +80° C. One of the most influential parameters which is sensitive to temperature is the switch peak current. This set-reset embodiment of FIG. 8 is less sensitive to variations in frequency due to temperature. Second, switching losses in switch S are controlled by selecting the appropriate switching frequency and mode of operation. Third, switching losses can be reduced by faster switching times of the switch S. The switching speed for switch S is controlled by the impedance of gate G3. The independent oscillator approach of FIG. 8 can also be implemented with a dual comparator approach similar to the approach described in FIG. 7 by using a standard D-type flip flop. Table 1 illustrates the exemplary component values.

An isolated embodiment can be implemented using the same topology as illustrated in FIGS. 2 and 6 by replacing the inductor L with a transformer TX1 as shown in FIG. 9. In this embodiment, it is preferable that the transformer TX1 has a small leakage inductance to supply a charge to capacitor CS associated with the switch control. In this embodiment, forward or flyback converter implementation is possible. Table 1 illustrates the exemplary component values.

FIG. 10 illustrates yet another preferred embodiment of the invention in which an optocoupling switch OPTO is responsive to a command voltage signal VCMD to enable or disable the operation of the supply so that the power supply is disabled (and the motor is not commutated) during periods when no power is supplied to the load. Table 1 illustrates the exemplary component values. In general, the optocoupler may be any communicating means controlled by a regulating voltage reference. In this embodiment, the optocoupler is an isolating circuit which is part of the load control circuit. As a result, the load control circuit includes a voltage regulation loop sensing the output voltage and modulating the switching circuit at a frequency which is lower than the frequency of the switching circuit as switched by the inductive circuit to keep the output voltage regulated.

In view of the above, it will be seen that the several objects of the invention are achieved and other advantageous results attained.

As various changes could be made in the above products without departing from the scope of the invention, it is intended that all matter contained in the above description and shown in the accompanying drawings shall be interpreted as illustrative and not in a limiting sense.

What is claimed is:

1. A power supply for supplying power from a direct current (DC) source to a load comprising:
    a load control circuit connected to the DC source and connected to the load for regulating a voltage applied to the load;
    an inductive circuit connected to the load control circuit load for supplying power to the load;
    a switching circuit connected between the DC source and the inductive circuit, said switching circuit initiating operation in response to a minimum input voltage and operating in response to the inductive circuit to selectively connect the DC source to the inductive circuit; and
    an initialization circuit connected between the DC source and the switching circuit for supplying an initialization current to the switching circuit, said initialization current establishing the minimum input voltage at which the switching circuit starts to operate.

2. The power supply of claim 1 wherein the switching circuit comprises a shunt circuit connected to the inductive circuit for sensing a current circulating in the inductive circuit, a switch for selectively connecting the inductive circuit to the DC source and a switch control circuit connected to the shunt and responsive to the voltage sensed by the shunt for selectively opening and closing the switch.

3. The power supply of claim 2 wherein the switch control circuit controls the switch to provide an off-time interval after an inductive circuit current has substantially decayed toward zero during which the switch does not connect the shunt circuit to the DC source thereby providing discontinuous operation.

4. The power supply of claim 2 wherein the switch control circuit controls the switch to selectively connect the inductive circuit to the DC source before an inductive circuit current has substantially decayed toward zero whereby substantially continuous operation is provided.

5. The power supply of claim 2 wherein the switch control circuit includes a bipolar transistor circuit for controlling the switch.

6. The power supply of claim 2 wherein the switch control circuit includes a comparator circuit for comparing a voltage developed in the shunt circuit to a voltage reference and comparing a voltage developed by free wheeling current to another voltage reference and wherein the switch is responsive to the comparator circuit.

7. The power supply of claim 2 wherein the switch control circuit includes an oscillator and a flip flop responsive to the oscillator for controlling the switch.

8. The power supply of claim 1 wherein the load control circuit includes an isolating circuit having a small leakage inductance supplying a charge to the switching circuit.

9. The power supply of claim 1 wherein the load control circuit includes an isolating circuit including a voltage regulation loop sensing the output voltage and modulating the switching circuit at a frequency which is lower than the frequency of the switching circuit as switched by the inductive circuit to keep the output voltage regulated.

10. The power supply of claim 1 wherein the switching circuit includes a switch responsive to a control signal to enable or sable the power supply whereby the power supply is disabled during periods when no power is supplied to the load.

11. A switching power converter for supplying power to a load control circuit connected to a load and connected to a direct current (DC) power source, the load control circuit for regulating a DC voltage applied to the load, said switching power converter comprising:

an inductive circuit connected to the load control circuit and/or connected to the load for supplying power to the load;

a switching circuit connected between the DC source and the inductive circuit, said switching circuit initiating operation in response to a minimum input voltage and operating in response to the inductive circuit to selectively connect the DC source to the inductive circuit; and an initialization circuit connected between the DC source and the switching circuit for supplying an initialization current to the switching circuit, said initialization current establishing the minimum input voltage at which the switching circuit starts to operate.

12. A motor for use with an alternating current (AC) source comprising:

a rectifier circuit connected to the AC source and providing a direct current (DC) source;

a rotatable assembly in driving relation to a motor winding for rotating the rotatable assembly;

a power switching circuit for selectively connecting the DC source to the motor winding;

a controller for controlling the power switching circuit to commutate the motor winding;

a load control circuit connected to the controller and to the DC source for regulating a voltage applied to the controller;

an inductive circuit connected to the load control circuit and/or connected to the controller for supplying power to the controller; and a switching circuit connected between the DC source and the inductive circuit, said switching circuit initiating operation in response to a minimum input voltage and operating in response to the inductive circuit to selectively connect the DC source to the inductive circuit; and an initialization circuit connected between the DC source and the switching circuit for supplying an initialization current to the switching circuit, said initialization current establishing the minimum input voltage at which the switching circuit starts to operate.

13. The motor of claim 12 wherein the switching circuit comprises a shunt circuit connected to the inductive circuit for sensing a current circulating in the inductive circuit, a switch for selectively connecting the inductive circuit to the DC source and a switch control circuit connected to the shunt and responsive to the voltage sensed by the shunt for selectively opening and closing the switch.

14. The motor of claim 13 wherein the switch control circuit controls the switch to provide an off-time interval after an inductive circuit current has substantially decayed toward zero during which the switch does not connect the shunt circuit to the DC source thereby providing discontinuous operation.

15. The motor of claim 13 wherein the switch control circuit controls the switch to selectively connect the inductive circuit to the DC source before an inductive circuit current has substantially decayed toward zero whereby substantially continuous operation is provided.

16. The motor of claim 13 wherein the switch control circuit includes a bipolar transistor circuit for controlling the switch.

17. The motor of claim 13 wherein the switch control circuit includes a comparator circuit for comparing a voltage developed in the shunt circuit to a voltage reference and comparing a voltage developed by free wheeling current to another voltage reference and wherein the switch is responsive to the comparator circuit.

18. The motor of claim 13 wherein the switch control circuit includes an oscillator and a flip flop responsive to the oscillator for controlling the switch.

19. The motor of claim 12 wherein the load control circuit includes an isolating circuit having a small leakage inductance supplying a charge to the switching circuit.

20. The motor of claim 12 wherein the load control circuit includes an isolating circuit including a voltage regulation loop sensing the output voltage and modulating the switching circuit at a frequency which is lower than the frequency of the switching circuit as switched by the inductive circuit to keep the output voltage regulated.

21. The motor of claim 12 wherein the switching circuit includes a switch responsive to a control signal to enable or disable the controller whereby the motor is disabled and not commutated during periods when no power is supplied to the load.

22. A power supply for supplying power from a direct current (DC) source to a load comprising:

a constant voltage load control circuit connected to the DC source and connected to the load for regulating a voltage applied to the load;

an inductive circuit connected to the constant voltage load control circuit load for supplying power to the load; and a switching circuit connected between the DC source and the inductive circuit and responsive to the inductive circuit wherein the inductive circuit supplies power to the switching circuit and controls the switching circuit to selectively connect the DC source to the inductive circuit.

23. The power supply of claim 22 wherein the constant voltage load control circuit further comprises a capacitor and zener diode connected in parallel whereby excess current due to load changes is diverted through the zener diode.

24. A motor for use with an alternating current (AC) source comprising:

a rectifier circuit connected to the AC source and providing a direct current (DC) source;

a rotatable assembly in driving relation to a motor winding for rotating the rotatable assembly;

a power switching circuit for selectively connecting the DC source to the motor winding;

a controller for controlling the power switching circuit to commutate the motor winding;

a constant voltage load control circuit connected to the controller and to the DC source for regulating a voltage applied to the controller;

an inductive circuit connected to the constant voltage load control circuit and/or connected to the controller for supplying power to the controller; and a switching circuit connected between the DC source and the inductive circuit and responsive to the inductive circuit wherein the inductive circuit supplies power to the switching circuit and controls the switching circuit to selectively connect the DC source to the inductive circuit.

25. The motor of claim 24 wherein the constant voltage load control circuit further comprises a capacitor and zener diode connected in parallel whereby excess current is diverted through the zener diode.

* * * * *